United States Patent
Horii

(10) Patent No.: US 7,605,087 B2
(45) Date of Patent: Oct. 20, 2009

(54) METHODS OF FORMING SEMICONDUCTOR DEVICES USING DI-BLOCK POLYMER LAYERS

(75) Inventor: Hideki Horii, Seoul (KR)

(73) Assignee: Samsung Electronics Co., Ltd. (KR)

( * ) Notice: Subject to any disclaimer, the term of this patent is extended or adjusted under 35 U.S.C. 154(b) by 80 days.

(21) Appl. No.: 11/830,284

(22) Filed: Jul. 30, 2007

(65) Prior Publication Data

US 2008/0064217 A1 Mar. 13, 2008

(30) Foreign Application Priority Data

Sep. 11, 2006 (KR) ...................... 10-2006-0087666

(51) Int. Cl.
*H01L 21/311* (2006.01)

(52) U.S. Cl. ........................ 438/703; 438/299; 438/287; 257/E21.205; 257/E21.249

(58) Field of Classification Search ................. 438/637, 438/703, 299, 102
See application file for complete search history.

(56) References Cited

U.S. PATENT DOCUMENTS

| 6,797,612 B2 | 9/2004 | Zahorik |
| 2005/0142731 A1 | 6/2005 | Wicker |
| 2005/0227496 A1 | 10/2005 | Park et al. |
| 2006/0072370 A1 | 4/2006 | Kuh et al. |
| 2006/0281216 A1 * | 12/2006 | Chang et al. ................. 438/102 |
| 2007/0293041 A1 * | 12/2007 | Yang et al. ................... 438/637 |
| 2008/0099845 A1 * | 5/2008 | Yang et al. ................... 257/351 |
| 2008/0274304 A1 * | 11/2008 | Cherkaoui et al. ............ 428/1.2 |

FOREIGN PATENT DOCUMENTS

| KR | 10-2000-0001909 | | 1/2000 |
| KR | 10-2005-0099589 | A | 10/2005 |
| KR | 10-2006-0016312 | A | 2/2006 |
| KR | 10-2006-0092398 | A | 8/2006 |
| KR | 10-0612913 | | 8/2006 |

* cited by examiner

*Primary Examiner*—N Drew Richards
*Assistant Examiner*—Mamadou Diallo
(74) *Attorney, Agent, or Firm*—Myers Bigel Sibley & Sajovec

(57) ABSTRACT

A method of forming a semiconductor device is provided. An interlayer dielectric is formed on a substrate. A di-block polymer layer that includes a plurality of first polymer blocks and a plurality of second polymer blocks is formed on the interlayer dielectric. The di-block polymer layer is divided into a first phase to which the first polymer blocks are bound and a second phase to which the second polymer blocks are bound. The second phase is removed so that at least part of the first phase remains in place, where the remaining first phase defines at least part of a pore. The interlayer dielectric that is exposed beneath the pore is etched to form an opening. The opening may have a smaller width than the minimum feature size that a photolithography process is capable of resolving. As a result, a linewidth of an electrode that may be formed to fill the opening may be reduced.

23 Claims, 5 Drawing Sheets

METHODS OF FORMING SEMICONDUCTOR DEVICES USING DI-BLOCK POLYMER LAYERS

CROSS-REFERENCE TO RELATED APPLICATIONS

This U.S. non-provisional patent application claims priority under 35 U.S.C. § 119 of Korean Patent Application 2006-87666 filed on Sep. 11, 2006, the contents of which are hereby incorporated by reference herein as if set forth in their entirety.

BACKGROUND

The present invention relates to semiconductor devices and, more particularly, to methods of forming semiconductor devices.

Non-volatile memory devices are memory device that retain stored data even when power is not being supplied to the device. Phase change memory devices are one type of non-volatile memory device. A unit cell of a phase change memory device (hereinafter referred to as "phase change memory cell") is the standard data storing element of a phase change memory device. Phase change memory cells have a stacked gate structure. Phase change materials have two stable states (i.e., an amorphous state and a crystalline state). The resistivity of a phase change material layer that has an amorphous state is higher than the resistivity of a phase change material layer that has a crystalline state. Using the resistivity difference resulting from states of a phase change material, data may be stored in, and read from, a phase change memory cell.

If a phase change material is rapidly cooled after being heated at a temperature higher than a melting temperature for a short time, it exhibits an amorphous state. On the other hand, if a phase change material is slowly cooled after being heated at a temperature higher than a crystallization temperature and lower than a melting temperature for a long time, it exhibits a crystalline state.

Conventionally, Joule heat is used to convert the state of the phase change material to an amorphous state or a crystalline state. The Joule heat is generated by flowing current through the phase change material and through a conductive plug which is in contact with the phase change material.

A phase change material requires a large amount of current to generate Joule heat for a program operation and/or an erase operation. As such, phase change memory devices may have relatively large power dissipation. Further, the plan area occupied by a switching element typically increases with increasing current. Accordingly, the relatively large current requirements may also increase the size of each phase change memory cell, making it more difficult to achieve high integration density.

SUMMARY OF THE INVENTION

Pursuant to embodiments of the present invention, methods of forming semiconductor devices are provided. Pursuant to these methods, an interlayer dielectric is formed on a substrate. A di-block polymer layer that comprises a plurality of first polymer blocks and a plurality of second polymer blocks is formed on the interlayer dielectric. The di-block polymer layer is divided into a first phase to which the first polymer blocks are bound and a second phase to which the second polymer blocks are bound. The second phase is removed so that at least part of the first phase remains in place to define at least part of a pore. The interlayer dielectric exposed beneath the pore is etched to form an opening.

In some embodiments of these methods, a mold layer may be formed on the interlayer dielectric. A guide opening may be formed that penetrates the mold layer. In these embodiments, the di-block polymer layer may be formed in the guide opening, and the pore may also be formed in the guide opening. In some embodiments, the remaining first phase may form a polymer spacer on a sidewall of the guide opening. The methods may also include removing the remaining first phase, forming an electrode and then forming a phase change material pattern on the electrode. In some embodiments, the heater electrode is generally pillar-shaped or annular-shaped. The first phase and the second phase may be divided, for example, by annealing the di-block polymer layer. The second phase may be removed, for example, by performing a developing process on the di-block polymer using a developer, where a solubility of the first polymer block to the developer is lower than a solubility of the second polymer block to the developer.

In some embodiments, the method may further include irradiating a light such as an ultraviolet light onto the di-block polymer layer that has been divided into the first phase and the second phase before performing the developing process, where the reaction sensitivity of the first polymer block to the light is different than the reaction sensitivity of the second polymer block to the light. The overall composition of the di-block polymer layer may comprise, for example, about 20 to about 70 percent by weight of the second polymer.

Pursuant to further embodiments of the present invention, methods of forming a phase change memory device are provided in which an interlayer dielectric is formed on a substrate. A second layer is formed on the interlayer dielectric, where the second layer has an opening that exposes a portion of the interlayer dielectric. A di-block polymer layer is formed in the opening. A central portion of the di-block polymer layer is removed to form a second opening. The interlayer dielectric beneath the second opening is etched so that the second opening exposes the substrate. A a conductive layer is formed in the second opening. Finally, a phase change memory device is formed on the conductive layer.

DETAILED DESCRIPTION

Figure 1:
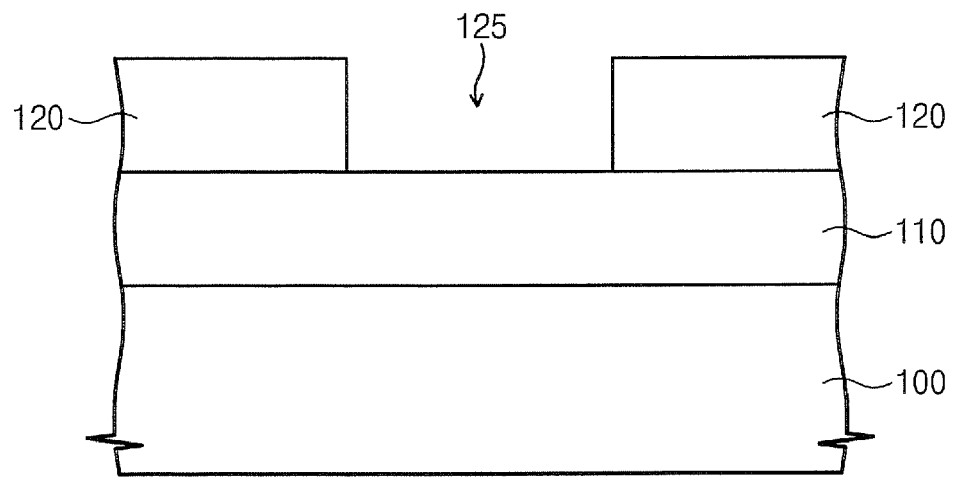
FIGS. 1 through 7 are cross-sectional views illustrating methods of forming phase change memory devices according to embodiments of the present invention.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings nay be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, operations, elements, and/or layers, but do not preclude the presence or addition of one or more other features, operations, elements, layers, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

FIGS. 1 through 7 are cross-sectional views illustrating methods of forming phase change memory devices according to embodiments of the present invention. FIG. 8 is a flowchart illustrating operations for forming a polymer spacer according to embodiments of the present invention.

Referring to FIG. 1, a first interlayer dielectric 110 is formed on a semiconductor substrate (hereinafter "substrate") 100. The substrate 100 may include a conductor (not shown), which is electrically connected to a switching element (not shown) such as a diode or a MOS transistor. The conductor may be electrically connected to the switching element through an underlying conductive material. Alternatively, the conductor may be a part of the switching element. The conductor may comprise a conductive material or a dopant-doped region of the substrate 100.

The first interlayer dielectric 110 may comprise, for example, a material selected from the group consisting of silicon oxide, silicon nitride, silicon oxynitride, and aluminum oxide. A mold layer 120 may be formed on the first interlayer dielectric 110, and may have an etch selectivity with respect to the first interlayer dielectric 110. The mold layer 120 may be an insulating material. For example, in the case where the first interlayer dielectric 110 is made of silicon oxide, the mold layer 120 may be formed from a material selected from the group consisting of silicon nitride, silicon oxynitride, aluminum oxide, and polysilicon; in the case where the first interlayer dielectric 110 is made of silicon nitride, the mold layer 120 may be made of a material selected from the group consisting of silicon oxide, silicon oxynitride, and polysilicon; in the case where the first interlayer dielectric 110 is made of silicon oxynitride, the mold layer 120 may be made of a material selected from the group consisting of silicon oxide, silicon nitride, and polysilicon; and in the case where the first interlayer dielectric 110 is made of aluminum oxide, the mold layer 120 may be made of either silicon oxide or polysilicon. It will be appreciated that other materials and/or different combinations of materials may be used to form the first interlayer dielectric 110 and the mold layer 120.

The mold layer 120 is patterned to form an opening 125 that exposes the first interlayer dielectric 110. A diameter or width of the opening 125 may be approximately the minimum feature size that a photolithography process is capable of resolving. It may also be larger than such a minimum feature size.

Figure 2:
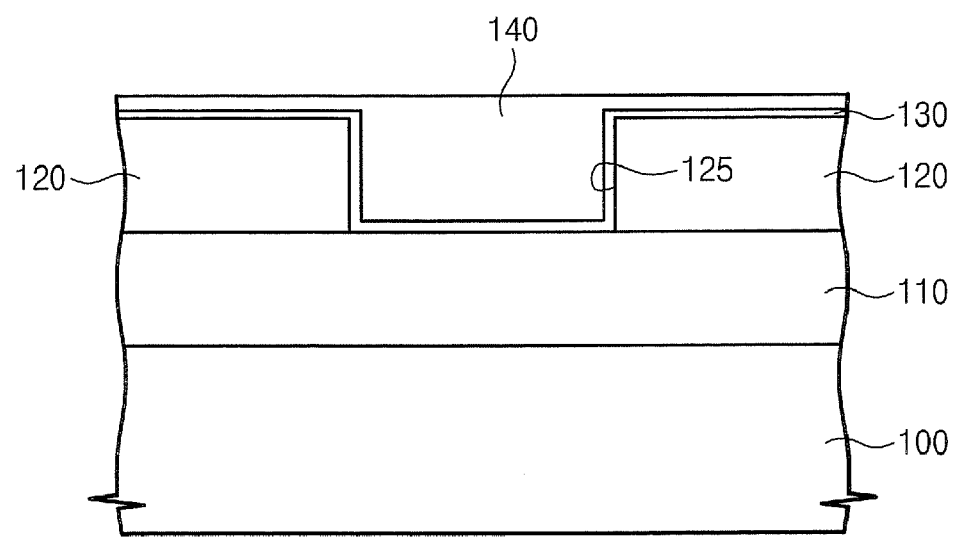
Figure 3:
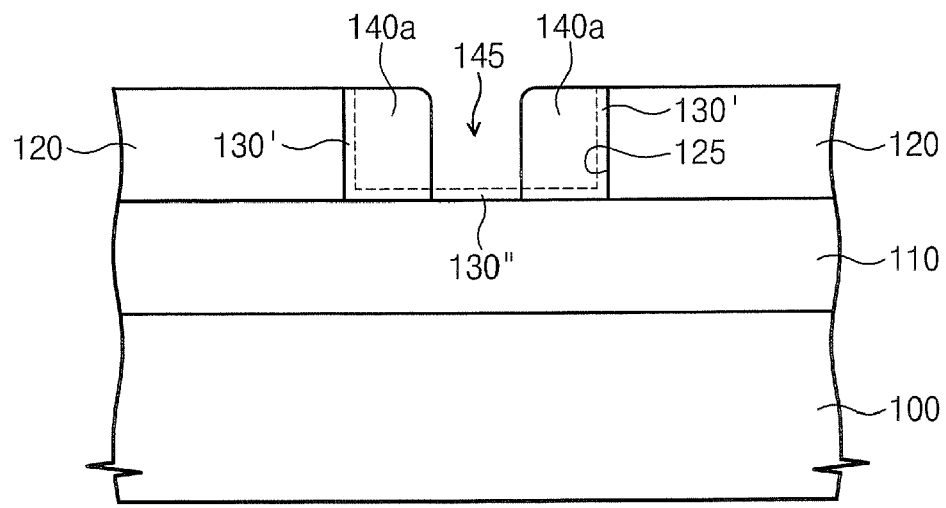

As illustrated in FIG. 3, a polymer spacer 140a is formed on the sidewall(s) of the opening 125. Operations that may be used to form the polymer spacer 140a will now be described below with reference to FIGS. 2 and 3 and the flowchart of FIG. 8.

Referring to FIGS. 2, 3, and 8, a di-block polymer layer 140 is formed on the substrate 100 to fill the guide opening 125 (S200). Herein, the term "di-block polymer" refers to a block copolymer having an A-B structure, wherein A may include a plurality of first polymer blocks and B may include a plurality of second polymer blocks. Each first polymer block includes first polymers, and each second polymer block includes second polymers. Monomers constituting the first polymer are defined as first monomers, and monomers constituting the second polymer are defined as second monomers. The size of the plurality of first polymer blocks may be random.

In other words, the number of the first monomers that each of the first polymer blocks includes may be random. The size of the plurality of second polymer blocks, and the number of the second monomers that each of the second polymer blocks includes, may likewise be random. The di-block polymer layer 140 may be formed by spin coating. Thus, the portion of the di-block polymer layer 140 that is in the opening 125 may have a larger thickness than the portion of the di-block polymer layer 140 which is formed on the top surface of the mold layer 120. The di-block polymer layer 140 formed on the top surface of the mold layer 120 may have a smaller thickness than the mold layer 120.

Prior to the formation of the di-block polymer layer 140, a surface polymer layer 130 may be formed on the substrate 100 and within (but only partially filling) the opening 125. The surface polymer layer 130 may be made of a polymer comprising a first monomer and a second monomer that are arranged and bound at random. The surface polymer layer 130 promotes adhesion between the di-block polymer layer 140 and the substrate 100. That is, the first and second monomers are arranged and bound at random to enable the surface polymer layer 130 to adhere to the mold layer 120 and the first interlayer dielectric 110. The surface polymer layer 130 also may have excellent adhesion to the di-block polymer layer 140. Thus, the surface polymer layer 130 may promote adhesion between the di-block polymer layer 140 and first interlayer dielectric 110 and the mold layer 120. The surface polymer layer 130 may be much thinner than the di-block polymer layer 140. The surface polymer layer 130 may be formed via spin coating. Accordingly, the portion of the surface polymer layer 130 formed on the top surface of the mold layer 120 may have a smaller thickness than the portion of the surface polymer layer 130 formed in the opening 125. In other embodiments of the present invention, the surface polymer layer 130 may be formed by a dipping method or an evaporation method. In such embodiments, the surface polymer layer 130 may be conformally formed on the substrate 100. In the case where the surface polymer layer 130 is formed via an evaporation method, a solid-state polymer may be evaporated using heat or e-beam. It will also be appreciated that the surface polymer layer 130 may be omitted, particularly in cases where the di-block polymer layer 140 has good adhesion to the first interlayer dielectric 110 and the mold layer 120.

Next, an annealing process may be performed on the di-block polymer layer 140 (S210). During the annealing process, the first polymer blocks in the di-block polymer layer 140 are bound to each other to create a first phase, and the second polymer blocks in the di-block polymer layer 140 are bound to each other to create a second phase. The first phase includes the first polymer and the second phase includes the second polymer. The annealing process may be performed, for example, at a temperature ranging from 100 to 300 degrees centigrade, although other annealing temperatures may be used. The first phase of the annealed di-block polymer layer 140 may be disposed adjacent to the sidewall of the opening 125. The second phase of the annealed di-block polymer layer 140 may be disposed at the center of the opening 125.

A light may be irradiated onto the annealed di-block polymer layer 140 (S220). A reaction sensitivity of the first polymer to the light may be different from the reaction sensitivity of the second polymer to the light. The light may be, for example, ultraviolet (UV) light.

A developing process is performed for the substrate 100 by using a developer to form a polymer spacer 140a on the sidewall of the opening 125. A solubility of the first polymer to the developer is lower than the solubility of the second polymer to the developer. By means of the developing process, the second phase of the di-block polymer layer 140 is removed. Thus, the polymer spacer 140a is formed of the first phase, i.e., the first polymer.

The developer may be selected from the group consisting of acetic acid, ketone-containing solution, alcohol-containing solution, and aldehyde-containing solution. The di-block polymer layer 140 including first and second polymers having different solubilities to the developer may comprise, for example, polystyrene-polymethylmethacrylate. The polystyrene corresponds to the first polymer, and the polymethylmethacrylate corresponds to the second polymer. Alternatively, the di-block polymer layer 140 may be one selected from the group consisting of polybutadiene-polybutylmethacrylate, polybutadiene-polydimethylsiloxane, polybutadiene-polymethylmethacrylate, polybutadiene-polyvinylpyridine, polyisoprene-polymethylmethacrylate, polyisoprene-polyvinylpyridine, polybutylacrylate-polymethylmethacrylate, polybutylacrylate-polyvinylpyridine, polyhexylacrylate-polyvinylpyridine, polyisobutylene-polybutylmethacrylate, polyisobutylene-polydimethoxysiloxane, polyisobutylene-polymethylmethacrylate, polyisobutylene-polyvinylpyridine, polybutylmethacrylate-polybutylacrylate, polybutylmethacrylate-polyvinylpyridine, polyethylene-polymethylmethacrylate, polymethylmethacrylate-polybutylacrylate, polymethylmethacrylate-polybutylmethacrylate, polystyrene-polybutadiene, polystyrene-polybutylacrylate, polystyrene-polybutylmethacrylate, polystyrene-polybutylstyrene, polystyrene-polydimethoxysiloxane, polystyrene-polyisoprene, polystyrene-polyvinylpyridine, polyethylene-polyvinylpyridine, polyvinylpyridine-polymethylmethacrylate, polyethyleneoxide-polyisoprene, polyethyleneoxide-polybutadiene, polyethyleneoxide-polystyrene, and polyethyleneoxide-polymethylmethacrylate. Other materials may also be used.

Due to the light irradiation (S220), the solubility of the second phase to the developer may increase and the solubility of the first phase to the developer may decrease. In the case where the reaction sensitivity of the first phase to the developer is lower than that of the second phase to the developer, the light reduces a bonding force of the second polymers constituting the second phase. On the other hand, in the case where the reaction sensitivity of the first phase to the developer is higher than that of the second phase to the developer, the light promotes a bonding force of the second polymers constituting the second phase. The light irradiation (S220) may be omitted in some embodiments.

An opening or "pore" 145 is formed in the di-block polymer layer 140 that is in the opening 125. The pore 145 is surrounded by the polymer spacer 140a. The di-block polymer layer 140 may have a predetermined thickness such that the annealing process (S210), the light irradiation (S220), and the developing process (S230) are performed to form the pore 145. The opening 125 and the di-block polymer layer 140, may each have a thickness ranging from, for example, about 5 to about 100 nanometers.

The portion of the di-block polymer layer 140 that is formed on the top surface of the mold layer 120 may have a considerably smaller thickness than the di-block polymer layer 140 that is in the opening 125. Thus, the di-block polymer layer 140 formed on the top surface of the mold layer 120 may be removed during the annealing process (S210), the light irradiation (S220), and/or the developing process (S230). In other embodiments, after the annealing process (S210), the light irradiation (S220), and the developing process (S230) are performed, a residual layer may exist on the top surface of the mold layer 120. The residual layer is formed of the first polymer of the di-block polymer layer 140.

In the embodiment where the surface polymer layer 130 is formed, a first residual pattern 130' may remain between the polymer spacer 140a and the inner sidewall of the opening 125 after the formation of the pore 145. The first residual pattern 130' may also be interposed between the polymer spacer 140a and the first interlayer dielectric 110. Further, a second residual pattern 130" may remain on the bottom surface of the pore 145. Since the surface polymer layer 130 has a considerably smaller thickness and is made of a polymer in which the first and second monomers are randomly arranged, the second residual pattern 130" may be removed by means of the annealing process (S210), the light irradiation (S220), and the developing process (S230). In other embodiments, the second residual pattern 130" may be removed by means of an etching process using the polymer spacer 140a as a mask. The pore 145 is formed to expose an upper portion of the first interlayer dielectric 110. After the processes S210, S220, and S230 are performed, the surface polymer layer 130 formed on the top surface of the mold layer 120 may be removed or may partially remain.

The overall composition of the di-block polymer layer 140 may comprise about 20 to about 70 percent by weight of the second polymer. The shape of the pore 145 may vary with a ratio of the second polymer, which is more sensitive to the light, in the di-block polymer layer 140. This will now be described below with reference to FIGS. 9A and 9B.

Figure 9A:
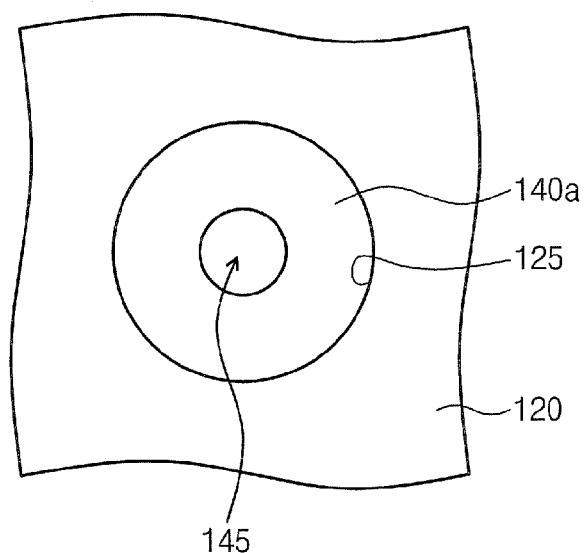
FIG. 9A is a top plan view illustrating one shape of a pore according to embodiments of the present invention.
Figure 9B:
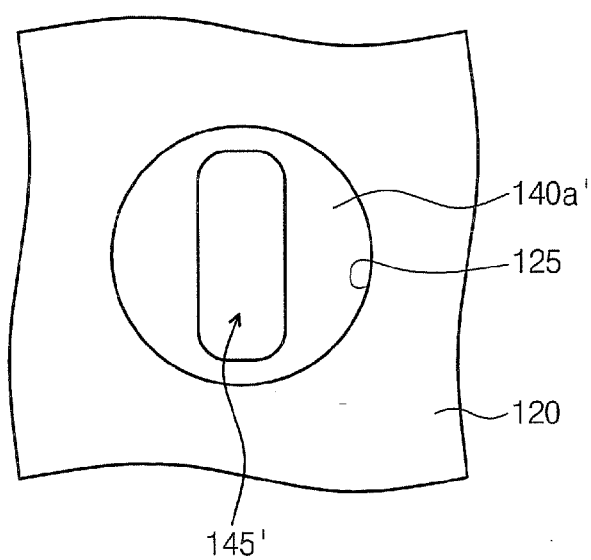
FIG. 9B is a top plan view illustrating another shape of a pore according to embodiments of the present invention.

FIG. 9A is a top plan view illustrating one shape of a pore formed according to embodiments of the present invention, and FIG. 9B is a top plan view illustrating another shape of a pore formed according to embodiments of the present invention.

Referring to FIG. 3 and FIGS. 9A and 9B, in the case where the second polymer comprises approximately 30 percent by weight (e.g., 20 to 40 percent by weight) of the di-block polymer layer 140, the pore 145 may be circular or oval, when viewed from the above, as illustrated in FIG. 9A. In the case where the second polymer comprises approximately 55 percent by weight (e.g., 45 to 70 percent by weight) in the di-block polymer layer 140, the pore 145' may be generally rectangular, when viewed from the above, as illustrated in FIG. 9B. Thus, the shape of the pore 145 may vary based upon the percentage of the second polymer in the di-block polymer layer 140. In particular, as the percentage of the second polymer included in the di-block polymer layer 140 increases, a second portion of the annealed di-block polymer layer 140 extends from the center of the opening 125 in one direction.

Processes that may be performed after the formation of the pore 145 will now be described below with reference to FIGS. 3 and 4.

Figure 4:
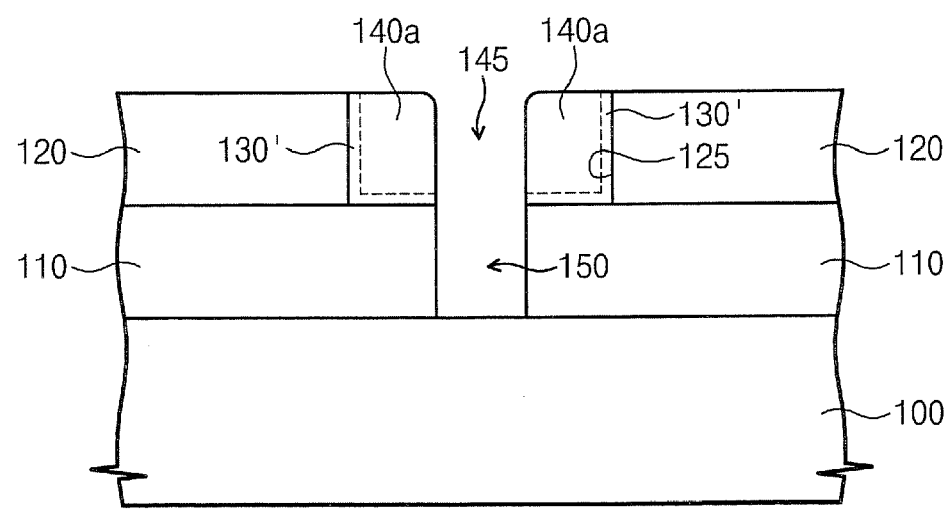

Referring to FIGS. 3 and 4, the exposed portion of the first interlayer dielectric 110 below the pore 145 is etched using the polymer spacer 140a as an etch mask to form a heater opening 150 that exposes a portion of the substrate 100. The portion of the substrate 100 that is exposed may be a portion of the substrate 100 that includes a conductor.

As described above, the opening 125 may be formed to be about the minimum feature size that a photolithography process is capable of resolving, and the polymer spacer 140a is formed at the opening 125 to define the pore 145. Thus, the width of the pore 145 may be much smaller than the minimum feature size that a photolithography process is capable of resolving. As a result, the width of the heater opening 150 may also be smaller than the minimum feature size that a photolithography process is capable of resolving. The heater opening 150 may be formed to have a minimum diameter ranging from about 1 to about 40 nanometers.

Figure 5:
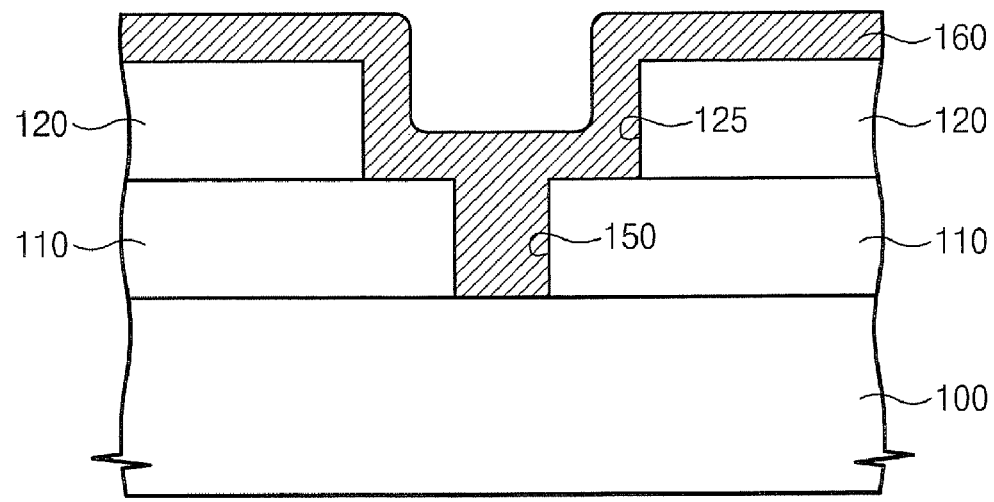

Referring to FIG. 5, the polymer spacer 140a is removed. In the case where the first residual pattern 130' exists below the polymer spacer 140a, it may be removed with the polymer spacer 140a. In the case where residual layers exist on the top surface of the mold layer 120, they may also be removed with the polymer spacer 140a. Thus, the opening 125 and the heater opening 150 are exposed.

Next, a heater conductive layer 160 may be formed on the substrate 100 and in at least a portion of the heater opening 150. The heater conductive layer 160 may fill the heater opening 150, as illustrated. Alternatively, following the formation of the heater conductive layer 160, a sacrificial insulation layer may be formed on the heater conductive layer 160. In this case, the heater conductive layer 160 and the sacrificial insulation layer are sequentially formed in the heater opening 150.

The heater conductive layer 160 may be made, for example, of at least one material selected from the group consisting of conductive metal nitrides (e.g., TiN, TaN, WN, MoN, NbN, TiSiN, TiAlN, TiBN, ZrSiN, WSiN, WBN, ZrAlN, MoSiN, MoAlN, TaSiN, TaAlN, etc.), conductive metal oxynitrides (e.g., TiON, TiAlON, WON, TaON, etc.), single metals (e.g., Ti, Ta, Zr, Hf, Mo, Al, W, Cu, etc.), metal-alloy (e.g., TiAl, Al—Cu, Al—Cu—Si, TiW, etc.), conductive metal silicides (e.g., WSi, etc.), and carbon.

Figure 6:
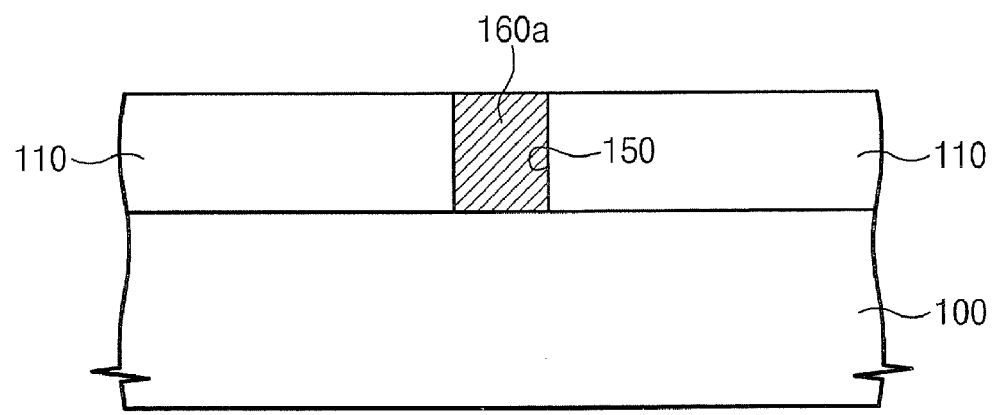

Referring to FIG. 6, the heater conductive layer 160 and the mold layer 120 may be planarized to expose the first interlayer dielectric 110 to form a heater electrode 160a in the heater opening 150. If the heater conductive layer 160 fills the heater opening 150, the heater electrode 160a may be, in some embodiments, pillar-shaped and may fill the heater opening 150. On the other hand, in the case where the heater conductive layer 160 and the sacrificial insulation layer sequentially fill the heater opening 150, the heater electrode 160a may, for example, have an annular shape to extend along the opening and the side of the heater opening 150.

Due to the heater opening 150, the heater electrode 160a has a smaller width than the minimum feature size that a photolithography process is capable of resolving.

Figure 7:
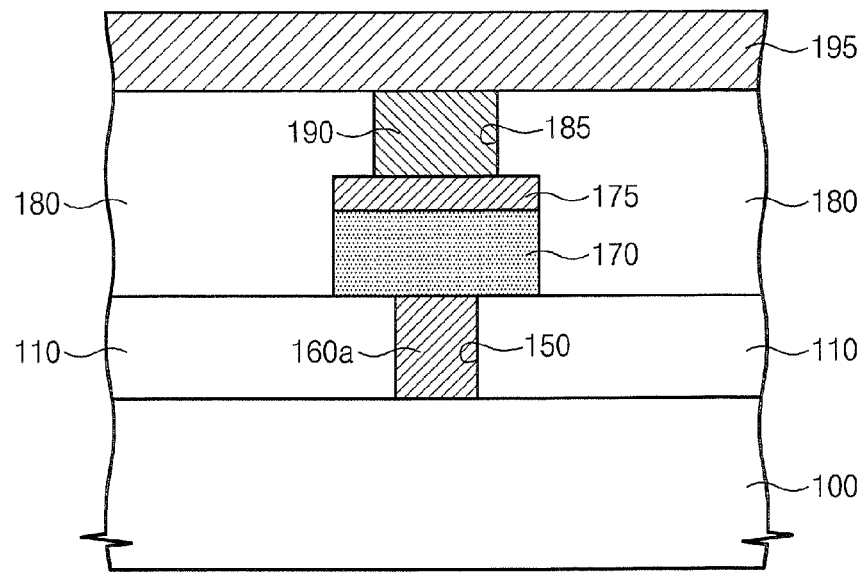
Figure 8:
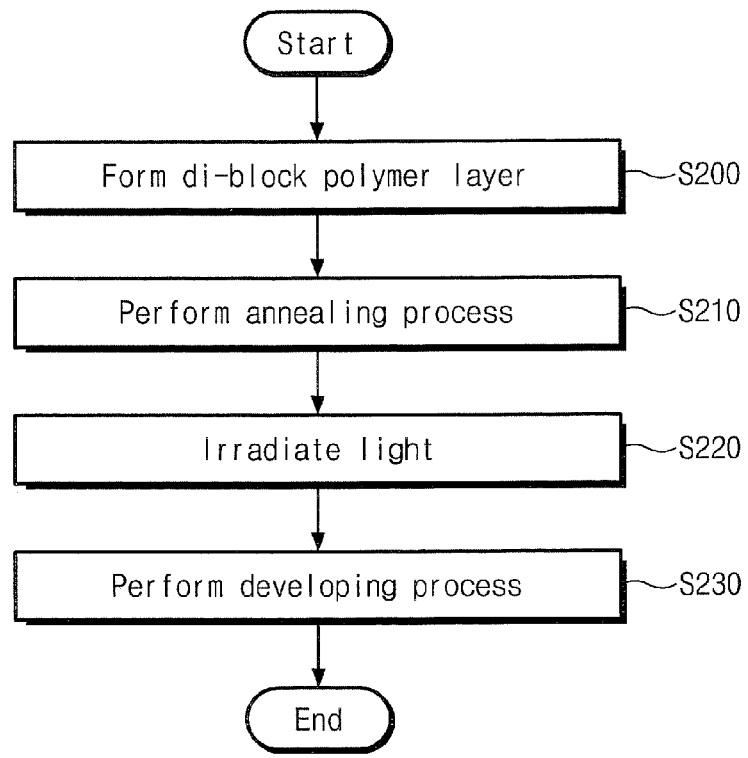
FIG. 8 is a flowchart illustrating operations for forming a polymer spacer in methods of forming phase change memory devices according to embodiments of the present invention.

Referring to FIG. 7, a phase change material layer and a capping conductive layer are sequentially formed on the substrate 100 including the pillar- or annular-shaped heater electrode 160a. The capping conductive layer and the phase change material layer are successively patterned to form a phase change material pattern 170 and a capping electrode 175 which are stacked in the order listed. The phase change material pattern 170 covers the top surface of the heater electrode 160a and is in contact with the same.

As described above, the heater electrode 160a has a smaller width than the minimum feature size that a photolithography process is capable of resolving. As such, the resistance of the heater electrode 160a increases. As a result, the amount of current flowing through the heater electrode 160a to convert the state of the phase change material pattern 170 may be reduced. This makes it possible to reduce the power dissipation of a phase change memory device and to reduce a plane area occupied by components (e.g., a switching element of a unit cell, a MOS transistor of a peripheral circuit, etc.) that are used to control the amount of current. Thus, a highly integrated phase change memory device may be achieved.

The phase change material pattern 170 may be made of a material containing at least one of tellurium (Te) and selenium (Se), which are chalcogenide group elements. More specifically, the phase change material pattern 170 may be made of, for example, Ge—Sb—Te, As—Sb—Te, As—Ge—Sb—Te, Sn—Sb—Te, Ag—In—Sb—Te, In—Sb—Te, 5A group element-Sb—Te, 6A group element-Sb—Te, 5A group element-Sb—Se, 6A group element-Sb—Se, Ge—Sb, In—Sb, Ga—Sb, and doped Ge—Sb—Te. The doped-Sb—Te may be doped with C, N, B, Bi, Si, P, Al, Dy or Ti. The capping electrode 175 may be made of at least one material selected from the group consisting of conductive metal nitrides (e.g., TiN, TaN, WN, MoN, NbN, TiSiN, TiAlN, TiBN, ZrSiN, WSiN, WBN, ZrAlN, MoSiN, MoAlN, TaSiN, TaAlN, etc.), conductive metal oxynitrides (e.g., TiON, TiAlON, WON, TaON, etc.), single metals (e.g., Ti, Ta, Zr, Hf, Mo, Al, W, Cu, etc.), metal-alloys (e.g., TiAl, Al—Cu, Al—Cu—Si, TiW, etc.), and conducive metal silicides (e.g., WSi, etc.).

A second interlayer dielectric 180 is formed on the substrate 100. The second interlayer dielectric 180 may be made, for example, of oxide. The second interlayer dielectric 180 is patterned, forming a bitline opening 185 to expose the capping electrode 175. The bitline opening 185 may be formed by a patterning process including a photolithography process. Thus, the bitline opening 185 may have a larger width than the heater opening 150.

A bitline plug 190 is formed in the bitline opening 185. A bitline 195 is formed on the second interlayer dielectric 180 to be electrically connected to the bitline plug 190. The bitline plug 190 is made of a conductive material such as, for example, a conductive metal nitride, a metal silicide, tungsten, aluminum, and/or copper. The bitline 195 is also made of a conductive material such as, for example, tungsten, aluminum, and/or copper. The bitline plug 190 may also be omitted, and the bitline 195 formed to extend downwardly into the bitline opening 185.

As explained above, a polymer spacer may be formed on the sidewall of an opening by using characteristics of a di-block polymer layer and an interlayer dielectric exposed by a pore that is surrounded by the polymer spacer is etched to form a heater opening. Accordingly, the heater opening has a smaller width than the minimum feature size that a photolithography process is capable of resolving. That is, the width of a heater electrode formed in the heater opening is reduced. For this reason, a resistance of the heater electrode increases. As a result, the amount of current flowing through the heater electrode to convert the state of the phase change material pattern may be reduced. This makes it possible to reduce the power dissipation of a phase change memory device and to achieve a highly integrated phase change memory device.

Although the present invention has been described in connection with the embodiments of the present invention illustrated in the accompanying drawings, it is not limited thereto. It will be apparent to those skilled in the art that various substitutions, modifications and changes may be made without departing from the scope and spirit of the invention.

What is claimed is:

1. A method of forming a semiconductor device, comprising:
   forming an interlayer dielectric on a substrate;
   forming a mold layer on the interlayer dielectric;
   forming a guide opening that penetrates the mold layer;
   forming a di-block polymer layer in the guide opening, the di-block polymer layer comprising a plurality of first polymer blocks and a plurality of second polymer blocks;
   dividing the di-block polymer layer into a first phase to which the first polymer blocks are bound and a second phase to which the second polymer blocks are bound;
   removing the second phase so that at least part of the first phase remains in place, wherein the remaining first phase defines at least part of a pore in the guide opening;
   etching the interlayer dielectric exposed beneath the pore to form an opening;
   removing the remaining the first phase;
   forming a conductive layer on the mold layer and in the opening; and
   planarizing the conductive layer and the mold layer to expose the interlayer dielectric and to form an electrode in the opening.

2. The method as set forth in claim 1, wherein the remaining first phase forms a polymer spacer on a sidewall of the guide opening.

3. The method as set forth in claim 1, wherein the mold layer has a thickness ranging from about 5 to about 10 nanometers.

4. The method as set forth in claim 1, further comprising:
   forming a phase change material pattern on the electrode.

5. The method as set forth in claim 1, wherein the electrode is generally pillar-shaped or annular-shaped.

6. The method as set forth in claim 1, wherein the di-block polymer is divided into the first phase and the second phase by annealing the di-block polymer layer.

7. The method as set forth in claim 1, wherein the second phase is removed by performing a developing process on the di-block polymer using a developer, wherein a first solubility of the first polymer block to the developer is lower than a second solubility of the second polymer block to the developer.

8. The method as set forth in claim 7, further comprising irradiating a light onto the di-block polymer layer that has been divided into the first phase and the second phase before performing the developing process, wherein a first reaction sensitivity of the first polymer block to the light is different than a second reaction sensitivity of the second polymer block to the light.

9. The method as set forth in claim 8, wherein the light is ultraviolet (UV) light.

10. The method as set forth in claim 7, wherein the developer is one selected from the group consisting of acetic acid, ketone-containing solution, alcohol-containing solution, and aldehyde-containing solution.

11. The method as set forth in claim 7, wherein the di-block polymer layer is made of one selected from the group consisting of polybutadiene-polybutylmethacrylate, polybutadiene-polydimethylsiloxane, polybutadiene-polymethylmethacrylate, polybutadiene-polyvinylpyridine, polyisoprene-polymethylmethacrylate, polyisoprene-polyvinylpyridine, polybutylacrylate-polymethylmethacrylate, polybutylacrylate-polyvinylpyridine, polyhexylacrylate-polyvinylpyridine, polyisobutylene-polybutylmethacrylate, polyisobutylene-polydimethoxysiloxane, polyisobutylene-polymethylmethacrylate, polyisobutylene-polyvinylpyridine, polybutylmethacrylate-polybutylacrylate, polybutylmethacrylate-polyvinylpyridine, polyethylene-polymethylmethacrylate, polymethylmethacrylate-polybutylacrylate, polymethylmethacrylate-polybutylmethacrylate, polystyrene-polybutadiene, polystyrene-polybutylacrylate, polystyrene-polybutylmethacrylate, polystyrene-polybutylstyrene, polystyrene-polydimethoxysiloxane, polystyrene-polyisoprene, polystyrene-polyvinylpyridine, polyethylene-polyvinylpyridine, polyvinylpyridine-polymethylmethacrylate, polyethyleneoxide-polyisoprene, polyethyleneoxide-polybutadiene, polyethyleneoxide-polystyrene, and polyethyleneoxide-polymethylmethacrylate.

12. The method as set forth in claim 1, further comprising forming a surface polymer layer on the substrate including the guide opening before forming the di-block polymer layer.

13. The method as set forth in claim 12, wherein the surface polymer layer is made of a polymer in which first monomers and second monomers are arranged at random, wherein the first monomers constitute a first polymer in the first polymer block and the second monomers constitute a second polymer in the second polymer block.

14. The method as set forth in claim 12, wherein the surface polymer layer is formed by a spin coating method, a dipping method, or an evaporation method.

15. The method as set forth in claim 1, wherein the overall composition of the di-block polymer layer comprises about 20 to about 70 percent by weight of the second polymer blocks.

16. The method as set forth in claim 1, wherein the di-block polymer layer is formed by a spin coating method.

17. The method as set forth in claim 1, wherein sizes of the first polymer blocks and sizes of the second polymer blocks are random.

18. The method as set forth in claim 1, wherein the pore is generally circular, oval rectangular or square when viewed from above.

19. A method of forming a semiconductor device, comprising:
- forming an interlayer dielectric on a substrate;
- forming a second layer on the interlayer dielectric, wherein the second layer has a first opening that exposes a portion of the interlayer dielectric;
- forming a di-block polymer layer in the first opening;
- removing a central portion of the di-block polymer layer to form a second opening;
- etching the interlayer dielectric beneath the second opening to form a third opening in the interlayer dielectric;
- removing a remainder of the di-block polymer layer;
- forming a conductive layer in the third opening and on the second layer;
- planarizing the conductive layer and the second layer to expose the interlayer dielectric and to form a heater electrode in the third opening in the interlayer dielectric; and
- forming a phase change material pattern on the heater electrode.

20. The method as set forth in claim 19, wherein the di-block polymer layer includes a plurality of first polymer blocks formed of first polymers and a plurality of second polymer blocks formed of second polymers, and wherein the method further comprises dividing the di-block polymer layer into a first phase to which the plurality of first polymer blocks are bound and a second phase to which the plurality of second polymer blocks are bound before the central portion of the di-block polymer layer is removed, wherein the second phase is in the central portion of the di-block polymer layer.

21. The method as set forth in claim 19, further comprising annealing the di-block polymer layer prior to removing the central portion of the di-block polymer layer.

22. The method as set forth in claim 20, wherein the central portion of the di-block polymer layer is removed by performing a developing process on the di-block polymer using a developer, wherein a solubility of the first polymer to the developer is lower than the solubility of the second polymer to the developer.

23. The method as set forth in claim 20, further comprising irradiating a light onto the di-block polymer layer that has been divided into the first phase and the second phase before performing the developing process, wherein a reaction sensitivity of the first polymer to the light is different than the reaction sensitivity of the second polymer to the light.

\* \* \* \* \*